United States Patent [19]

Manning et al.

[11] Patent Number: 5,604,714
[45] Date of Patent: Feb. 18, 1997

[54] DRAM HAVING MULTIPLE COLUMN ADDRESS STROBE OPERATION

[75] Inventors: Troy A. Manning; Todd Merritt; Brett Williams, all of Boise, Id.

[73] Assignee: Micron Technology, Inc., Boise, Id.

[21] Appl. No.: 565,420

[22] Filed: Nov. 30, 1995

[51] Int. Cl.$^6$ .................. G11C 7/00; G11C 8/00
[52] U.S. Cl. .................. 365/230.08; 365/189.05; 365/189.08; 365/193; 365/238.5
[58] Field of Search .................. 365/230.08, 236, 365/238.05, 189.05, 189.08, 193

[56] References Cited

U.S. PATENT DOCUMENTS

| | | | |
|---|---|---|---|
| 5,331,593 | 7/1994 | Merritt et al. | 365/189.11 |
| 5,349,566 | 9/1994 | Merritt et al. | 365/233.5 |
| 5,457,659 | 10/1995 | Schaefer et al. | 365/222 |
| 5,526,320 | 6/1996 | Zagar | 365/238.05 |

*Primary Examiner*—David C. Nelms
*Assistant Examiner*—Trong Phan
*Attorney, Agent, or Firm*—Schwegman, Lundberg, Woessner & Kluth, P.A.

[57] ABSTRACT

A dynamic memory device is described which has multiple column address signal inputs. Data can be stored in the memory and selectively read therefrom. The column address signals are used to control the data communication. During a read operation, any one of the multiple column address signal inputs can be used to output data on all external communication lines. During a write operation, each column address signal input writes data from a portion of the external communication lines to the memory device.

17 Claims, 6 Drawing Sheets

DRAM HAVING MULTIPLE COLUMN ADDRESS STROBE OPERATION

TECHNICAL FIELD OF THE INVENTION

The present invention relates generally to memory devices and in particular the present invention relates to memory devices having multiple column address strobe signals.

BACKGROUND OF THE INVENTION

A wide variety of integrated circuit memories are available for storing data. One type of memory is the dynamic random access memory (DRAM). A DRAM is designed to store data in memory cells formed as capacitors. The data is stored in a binary format; a logical "one" is stored as a charge on a capacitor, and a logical "zero" is stored as a discharged capacitor. The typical DRAM is arranged in a plurality of addressable rows and columns. To access a memory cell, a row is first addressed so that all memory cells coupled with that row are available for accessing. After a row has been addressed, at least one column can be addressed to pinpoint at least one specific memory cell for either data input or output. The data stored in the memory cells is, therefore, accessible via the columns.

With the constant development of faster computer and communication applications, the data rates in which a memory circuit must operate continue to increase. To address the need for increased data rates, a variety of DRAMs are commercially available. These memories are produced in a variety of designs which provide different methods of reading from and writing to the dynamic memory cells of the memory. One such method is page mode operation. Page mode operations in a DRAM are defined by the method of accessing a row of a memory cell array and randomly accessing different columns of the array. Data stored at the row and column intersection can be read and output while that column is accessed. Page mode DRAMs require access steps which limit the communication speed of the memory circuit.

An alternate type of memory circuit is the extended data output (EDO) memory which allows data stored at a memory array address to be available as output after the addressed column has been closed. This memory circuit can increase some communication speeds by allowing shorter access signals without reducing the time in which memory output data is available on the communication lines. Column access times are, therefore, "masked" by providing the extended data output. A more detailed description of a DRAM having EDO features is provided in the "1995 DRAM Data Book" pages 1-1 to 1-30 available from Micron Technology, Inc. Boise, Id., which is incorporated herein by reference.

Memory circuits which have more than eight I/O communication lines typically require multiple column address strobe signals (CAS*). These signals are used to read from the memory and write to the memory in separate bytes. That is, one access signal controls one byte of the I/O and the other access signal controls another byte of the I/O. Using two or more column address strobe signals to control the input and output of the memory, however, increases current consumption and reduces the speed of the memory due to skew between the address signals.

For the reasons stated above, and for other reasons stated below which will become apparent to those skilled in the art upon reading and understanding the present specification, there is a need in the art for a memory circuit which can be operated using multiple address signals while operating at fast data output rates.

SUMMARY OF THE INVENTION

The above mentioned problems with multiple CAS* memories and other problems are addressed by the present invention and which will be understood by reading and studying the following specification. A memory device is described which uses multiple CAS* signals differently depending upon the input/output operation being performed.

In particular, the present invention describes an integrated memory circuit comprising an array of memory cells arranged in rows and columns, column address strobe inputs, and data output circuitry for reading bytes of data stored in the array. The bytes of data are output on communication lines in response to a signal provided on one of the column address strobe inputs. The memory circuit also includes data input circuitry for storing one byte of data in the array in response to a signal provided on one of the column address strobe inputs.

The data output circuitry can comprise a control circuit having a read signal generator for producing a read signal in response to a signal on one of the column address strobe inputs, and an output buffer coupled to the control circuit for outputting on the communication lines bytes of data stored in the array in response to the read signal. The data input circuitry can comprise a control circuit having write signal generators, each write signal generator for producing write signals in response to the column address strobe inputs, and an input buffer coupled to the control circuit for inputting one byte of data provided on the communication lines in response to one of the write signals.

In another embodiment, a dynamic random access memory (DRAM) is described which comprises an array of memory cells arranged in rows and columns, first and second column address strobe inputs, and communication line inputs and outputs. The memory also includes control circuitry for storing in the array one byte of data received on the communication line inputs in response to a signal provided on the first column address strobe input, and for storing in the array one byte of data received on the communication line inputs in response to a signal provided on the second column address strobe input. The control circuitry further outputs two bytes of data in response to a signal received on either the first or second column address strobe input.

In yet another embodiment, a method of data storage in a memory device is described. The method comprises the steps of storing a plurality of bytes of data in the memory device in response to a plurality of column address strobe signals, and outputting a plurality of bytes of data from the memory device in response to one column address strobe signal.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
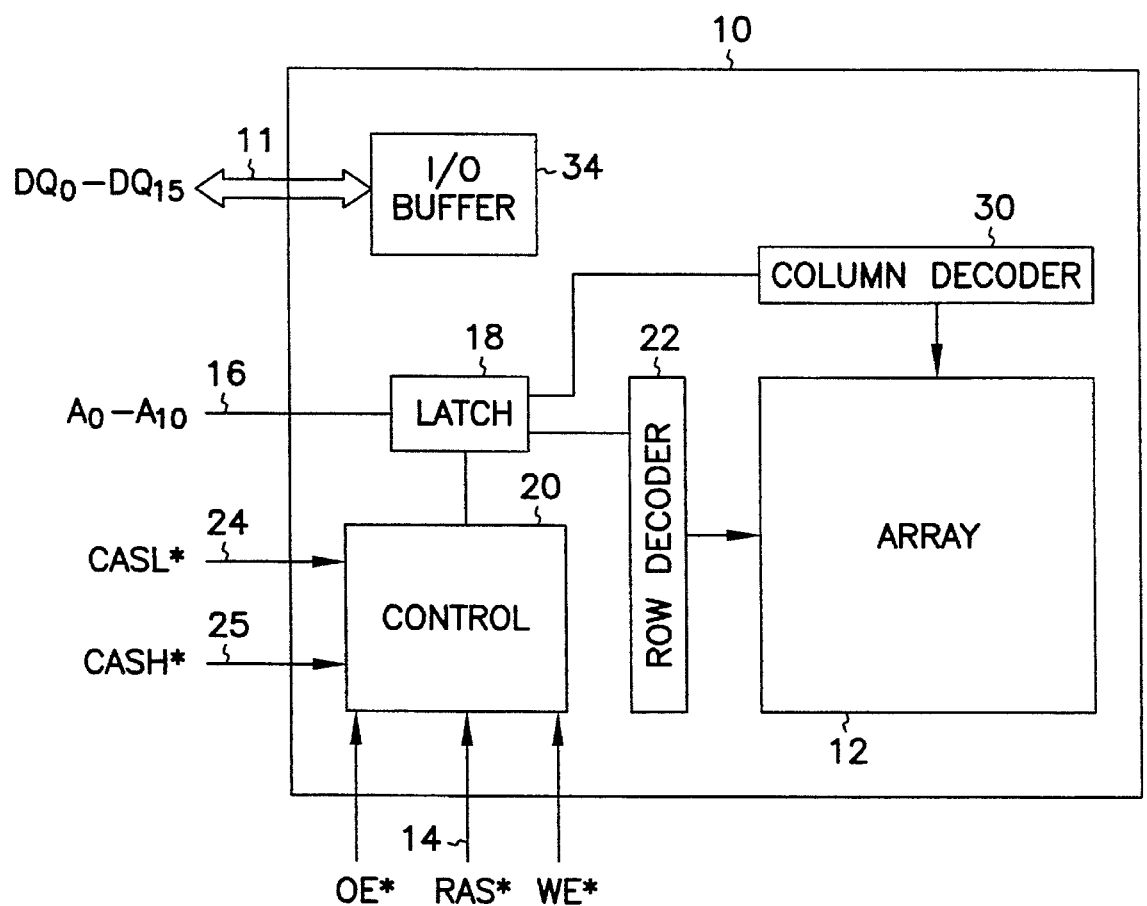
FIG. 1 is a block diagram of an extended data output memory device.

To fully appreciate the present invention, a description is provided of a typical extended data output memory circuit (EDO). It will be understood by those skilled in the art that the following description has been simplified to explain the features and benefits of the present invention and is not intended to be an exhaustive explanation of DRAM memories. FIG. 1 is a schematic representation of a sixteen megabit device designed to operate in an extended data out mode. The device is organized as a 1 Meg×16 EDO DRAM 10 having a sixteen bit data input/output path 11 providing data storage for 2,097,152 bytes of information in the memory array 12. An active-low row address strobe (RAS*) signal 14 is used to latch a first portion of a multiplexed memory address, from address inputs AO through A10 16, in latch 18. The latched row address is decoded in row decoder 22. The decoded row address is used to select a row of the memory array 12. Two active-low column address strobe (CASL* and CASH*) signals 24 and 25 are used to latch a second portion of a memory address from address inputs 16. The latched column address is decoded in column address decoder 30. The decoded column address is used to select a column of the memory array 12. Control circuitry 20 is used to control all operations of the memory, including accessing array 12.

Figure 2:
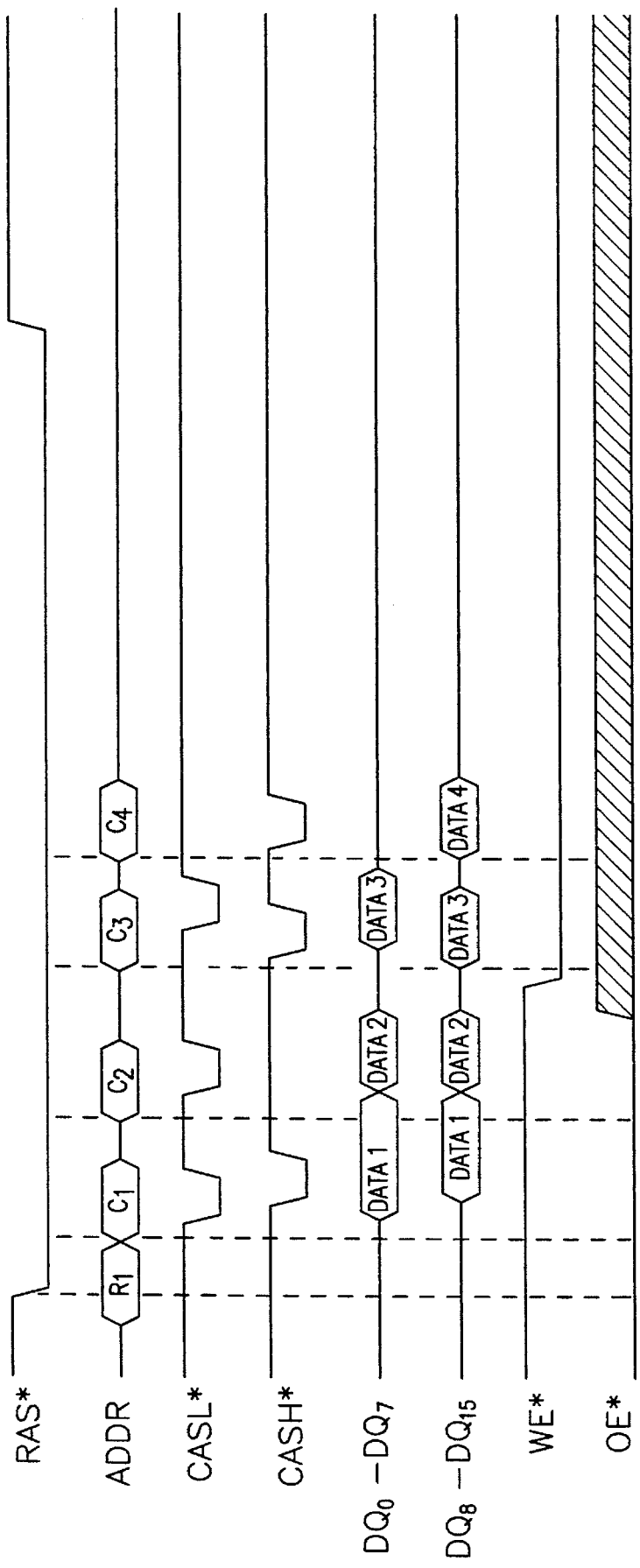
FIG. 2 is a timing diagram of the memory of FIG. 1.

In a read cycle, data within the memory array located at the row and column address selected by the row and column address decoders is read out of the memory array and sent to input/output buffer 34. To output two bytes of data read from the memory array, both CASL* and CASH* must transition low while the output enable (OE*) is active and the write enable (WE*) is inactive. Similarly, to write two bytes of data to the array, both CASL* and CASH* must transition low while WE* is active. FIG. 2 illustrates a read operation followed by a write operation in the memory 10 of FIG. 1. On the falling edge of RAS* a row address R1 is latched from the address inputs. On the first falling edge of CASL* an initial column address C1 is latched from the address inputs. With the WE* line high and the OE* low, one byte of data D1 stored at column C1 is output on $DQ_0$–$DQ_7$. When CASH* transitions low, a second byte of data D1 stored at column C1 is output on $DQ_8$–$DQ_{15}$. The time required to read both bytes of data, therefore, is dependent upon the availability of both CASL* and CASH* cycles. Any timing skew between CASL* and CASH* will slow the memory data output rate. Because both CASL* and CASH* transitioned low during one RAS* cycle, on the second CASL* cycle a new column address C2 is accessed and two bytes of data D2 stored at column C2 is output on $DQ_0$–$DQ_{15}$. That is, after both CASL* and CASH* cycle once during a RAS* cycle, data will be output on $DQ_0$–$DQ_{15}$ when either CASL* or CASH* transitions low. The OE* signal transitions high thereby terminating the data output, and then WE* transitions low in preparation for a write operation. On the falling edge of CASH* column address C3 is latched and the input data D3 provided on $DQ_8$–$DQ_{15}$ is written to the upper byte of the memory array. When CASL* transitions low, input data D3 provided on $DQ_0$–$DQ_7$ is written to the lower byte of the memory array. Data input D4 will be written to the upper byte on the next CASH* cycle, while no new data will be written to the lower byte of the memory array at column address C4. Data output from memory 10 is limited both by the speed of the CAS* signals and by the timing skew between the CASL* and CASH* signals. It will be appreciated that the above described memory could have been any DRAM operating in either page mode or EDO.

Multiple CAS Operations

Figure 3:
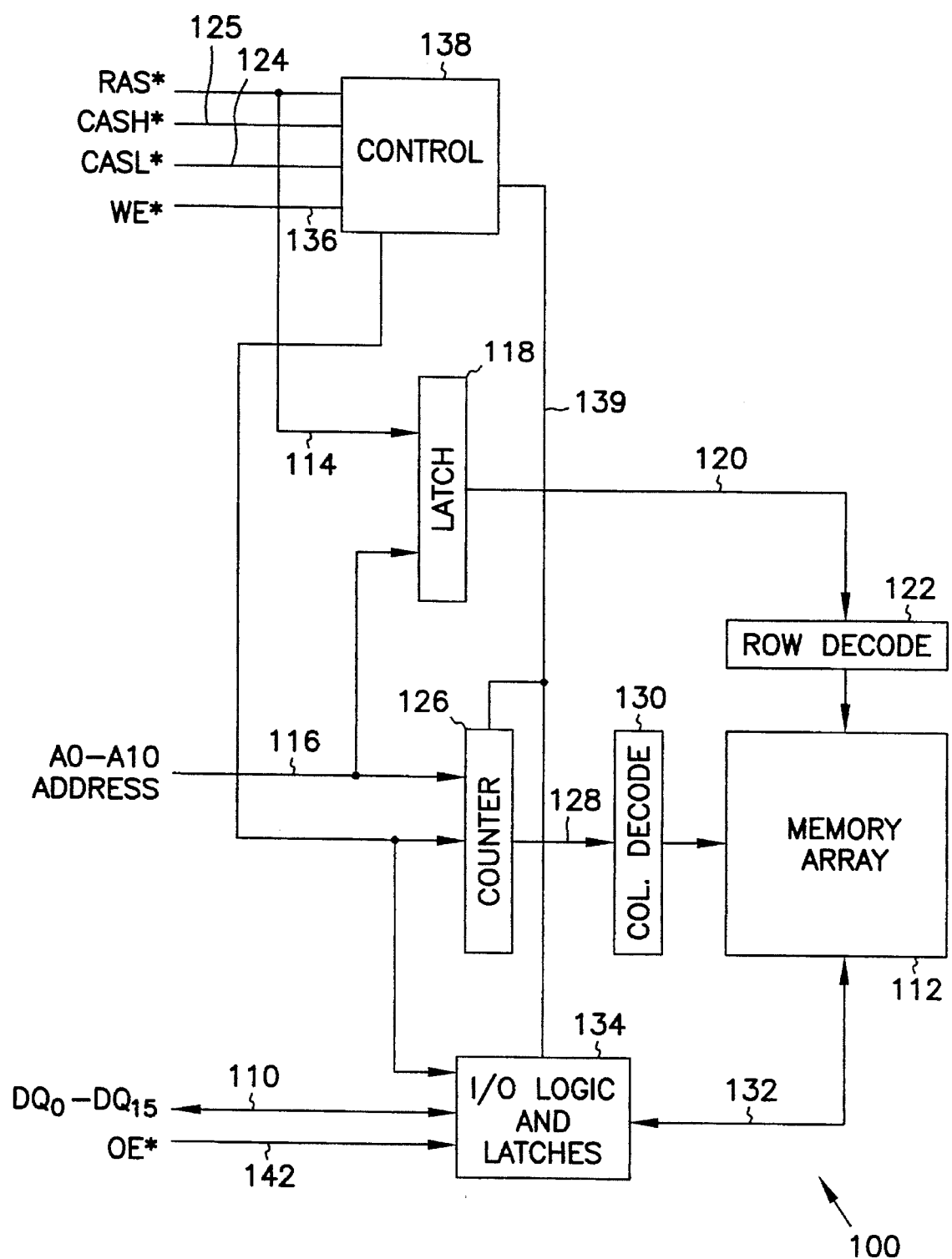
FIG. 3 is a block diagram of a burst access memory of the present invention.

To eliminate the adverse effects of skew between CAS* signals in multiple CAS* memories, the present invention provides CAS* control circuitry. One embodiment of a memory 100 incorporating the present invention is illustrated in FIG. 3. The device is organized as a 1 Meg×16 burst EDO DRAM 100 having a sixteen bit data input/output path 110 providing data storage for 2,097,152 bytes of information in the memory array 112. An active-low row address strobe (RAS*) signal 114 is used to latch a first portion of a multiplexed memory address, from address inputs AO through A10 116. The latched row address 120 is decoded in row decoder 122. The decoded row address is used to select a row of the memory array 112. Two active-low column address strobe (CASL* and CASH*) signals 124 and 125 are used to latch a second portion of a memory address from address inputs 116 into column address counter 126. Control circuit 138 produces an internal signal, BEDOCAS*, from the CASL* and CASH* signals. That is, in a preferred embodiment the BEDOCAS* signal will be low any time either CASL* or CASH* is low, as explained below. The latched column address 128 is decoded in column address decoder 130. The decoded column address is used to select a column of the memory array 112.

In a burst read cycle, data within the memory array located at the row and column address selected by the row and column address decoders is read out of the memory array and sent along data path 132 to output latches. Column address counter 126 advances the column address such that a "burst" of data from different column locations is output. The column address may be advanced linearly, or in an interleaved fashion for maximum compatibility with the overall system requirements. Once the memory device begins to output data in a burst read cycle, the I/O logic and latches 134 will continue to drive the data lines without tri-stating the data outputs during BEDOCAS* high intervals dependent on the state of the output enable and write enable (OE* and WE*) control lines, thus allowing additional time for the system to latch the output data. The data outputs remain valid throughout the burst read cycles with the exception of brief periods of data transition. During these periods of data transition, the output drivers may be turned off momentarily in order to aid data transition.

In the burst access memory device, each new column address from the address generation circuit is decoded and is used to access additional data within the memory array without the requirement of additional column addresses being specified on the address inputs 116. This burst sequence of data will continue for each BEDOCAS* falling edge until a predetermined number of data accesses equal to the burst length has occurred. A BEDOCAS* falling edge after the last burst address has been generated will latch another column address from the address inputs 116 and a new burst sequence will begin.

For a burst write cycle, data is latched in I/O logic and latches 134. Data targeted at the first address specified by the row and column addresses is latched with a BEDOCAS* signal when the first column address is latched (write cycle data latency is zero). Other write cycle data latency values are possible; however, for today's memory systems, zero is preferred. Additional input data words for storage at incremented column address locations are latched by a BEDOCAS* on successive BEDOCAS* signals. Input data from the I/O logic and latches 134 is passed along data path 132 to the memory array where it is stored at the location selected by the row and column address decoders. As in the burst read cycle previously described, a predetermined number of burst access writes will occur without the requirement of additional column addresses being provided on address lines 116. After the predetermined number of burst writes has occurred, a subsequent BEDOCAS* cycle will latch a new beginning column address, and another burst read or write access will begin.

The write enable signal is used in burst access cycles to select read or write burst accesses when the initial column address for a burst cycle is latched by BEDOCAS*. WE* low at the column address latch time selects a burst write access. WE* high at the column address latch time selects a burst read access. The level of the signal must remain high for read and low for write burst accesses throughout the burst access. A low to high transition within a burst write access will terminate the burst access, preventing further writes from occurring. A high to low transition on WE* within a burst read access will likewise terminate the burst read access and will place the data output 110 in a high impedance state. Transitions of the WE* signal may be locked out during critical timing periods within an access cycle in order to reduce the possibility of triggering a false write cycle. After the critical timing period the state of WE* will determine whether a burst access continues, is initiated, or is terminated. Termination of a burst access places the DRAM in a state to receive another burst access command. Both RAS* and BEDOCAS* going high during a burst access will also terminate the burst access cycle and place the data drivers in a high impedance output state. In the case of burst reads, WE* will transition from high to low to terminate a first burst read, and then WE* will transition back high prior to the next falling edge of BEDOCAS* in order to specify a new burst read cycle. For burst writes, WE* would transition high to terminate a current burst write access, then back low prior to the next falling edge of BEDOCAS* to initiate another burst write access.

Figure 4C:
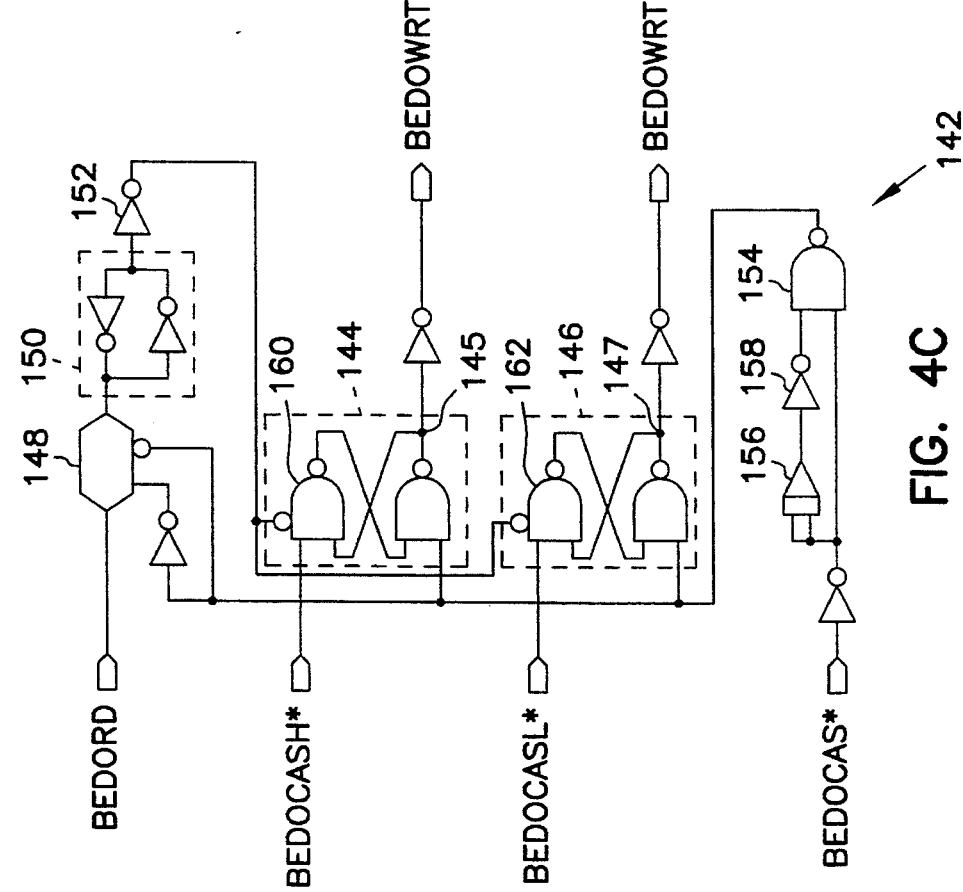
FIG. 4c is a schematic diagram of write control circuitry of FIG. 3.
Figure 4A:
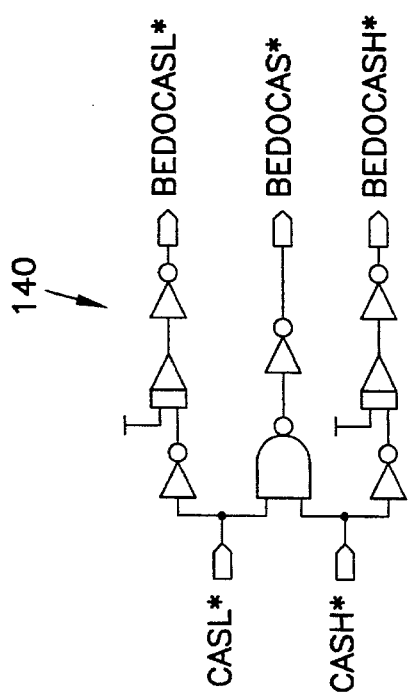
FIG. 4a is a schematic diagram of a signal generation circuit of FIG. 3.
Figure 4B:
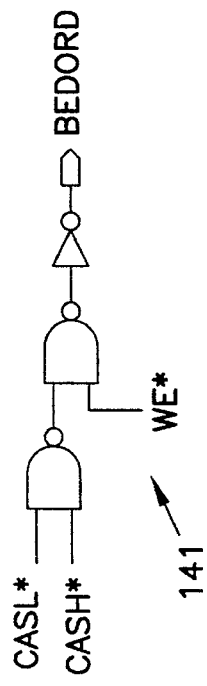
FIG. 4b is a schematic diagram of another signal generation circuit of FIG. 3.

The memory device 100 incorporating the present invention includes CASL* and CASH* control circuitry illustrated in FIGS. 4a, 4b and 4c. This circuitry is included in control 138 and allows the CASL* and CASH* signals to be used differently for controlling read and write operations. As explained below, one byte of data will be written to the memory array in response to either CASL* or CASH*. Two bytes of data, however, will be output in response to either CASL* or CASH*. This multiple function GAS* allows for faster data output by eliminating delays due to timing skew between CASL* and CASH*. Further, the need for two GAS* cycles (CASL* and CASH*) to output 16 bits of data is also eliminated.

Referring to FIGS. 4a, 4b, 4c, one embodiment of a BEDOCAS* generator circuit 140 is illustrated for producing BEDOCAS*, BEDOCASL* and BEDOCASH* signals using the external CASL* and CASH* signals. The BEDOCAS* signal will be low any time either CASL* or CASH* is low. Write control circuitry 142 is provided to produce BEDO write high (BEDOWRTH) and BEDO write low (BEDOWRTL) signals. The BEDOWRTH signal controls the writing of data to the upper byte through $DQ_8$–$DQ_{15}$, and the BEDOWRTL signal controls the writing of data to the lower byte through $DQ_0$–$DQ_7$.

FIG. 4b illustrates one embodiment of a BEDO read signal (BEDORD) generator circuit 141. The BEDORD signal will be low when either CASL* or CASH* are low when the write enable (WE*) signal is high. The BEDORD signal is used to output data from the memory 100, as explained below.

Referring to FIG. 4c, flip-flop 144 produces the BEDOWRTH signal in response to BEDOCASH*. In operation, the output 145 of flip-flop 144 will be low when the output of NAND gate 154 is high and BEDOCASH* is low. NAND gate 154 will produce a low pulse in response to a low transition in BEDOCAS*. The length of the pulse will be directly dependent upon the length of delay element 156. The BEDOWRTH signal will be latched low when the output of NAND gate 154 is low. When the output of NAND gate 154 is low, multiplex circuit 148 is enabled and the read signal (BEDORD) is latched in latch 150. If BEDORD is low, flip-flops 144 and 146 will be enabled. When the output of NAND gate 154 returns high following the completion of the delay, the output 145 will either remain low if BEDOCASH* is high, or transition high if BEDOCASH* is low. The next low transition of BEDOCAS* will reset flip-flop 144 and force BEDOWRTH to a low signal. Flip-flop 146 will operate in the same manner as flip-flop 144. That is, BEDOWRTL will be low when the output of NAND gate 154 is low and will follow the inverse of BEDOCASL* when the output of NAND gate 154 transitions high. If BEDORD is high when BEDOCAS* transitions low, NAND gates 160 and 162 of flip-flops 144 and 146 are disable. BEDOWRTH and BEDOWRTL, therefore, will be latched at a low level during burst read operations.

Figure 5:
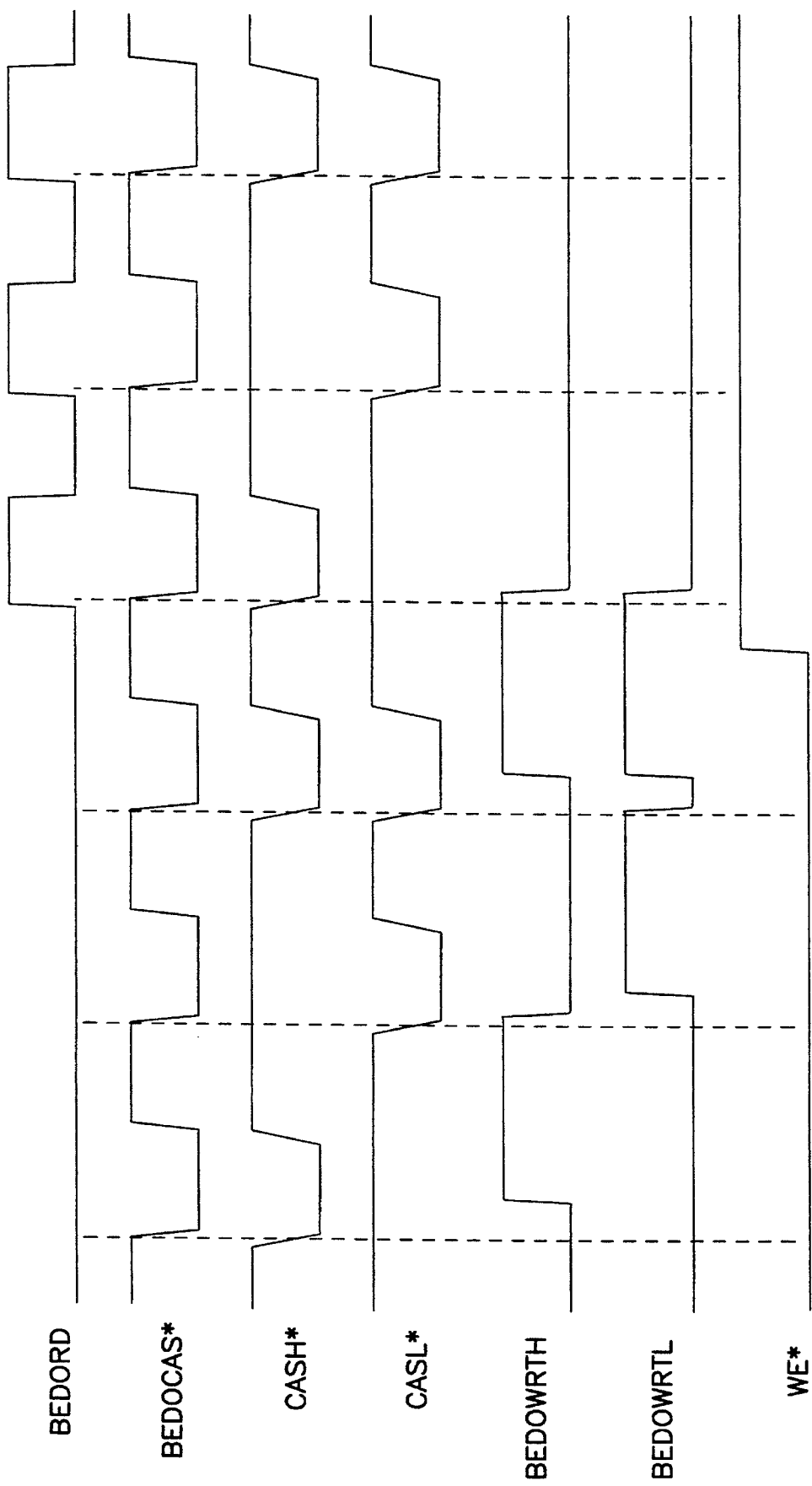
FIG. 5 is a timing diagram of the circuitry of FIGS. 4a, 4b, and 4c.

FIG. 5 illustrates the operation of circuit 142. BEDOCAS* transitions low in response to the first low transition of CASH*. With CASH* low, the BEDOWRTH signal transitions high following the delay established by delay element 156. On the next BEDOCAS* signal, BEDOWRTH goes low and remains low. With CASL* low, however, the BEDOWRTL signal transitions high following the delay established by delay element 156. On the third BEDOCAS* cycle, both BEDOWRTH and BEDOWRTL go high in response to CASH* and CASL*. Because the BEDORD signal goes high prior to the next BEDOCAS* cycle, both BEDOWRTH and BEDOWRTL are latched low during subsequent CASH* and CASL* transitions.

With the WE* signal high, BEDORD will transition high when either CASH* or CASL* is low, see FIG. 4b. As such, the BEDORD signal is high during the delay period in which the output of NAND gate 154 is low. As stated above, the BEDOWRTH and BEDOWRTL are therefore latched low during subsequent CASH* and CASL* transitions.

Figure 6:
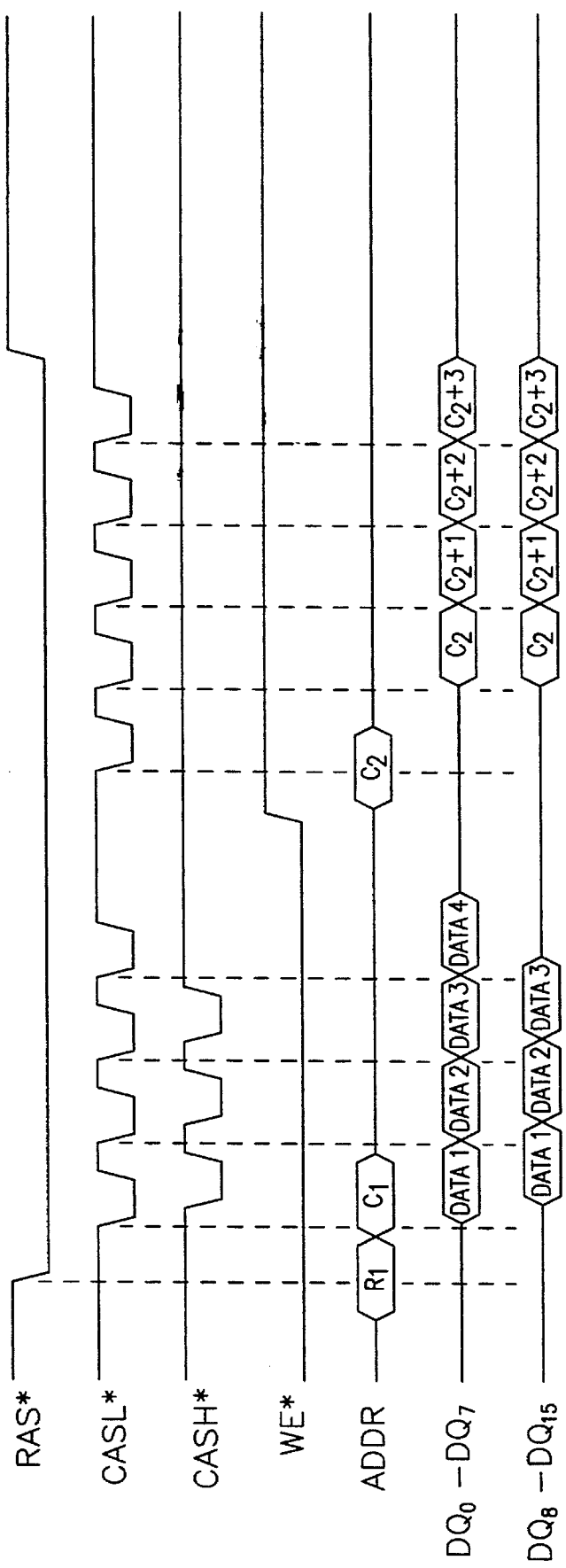
FIG. 6 is a timing diagram of the memory of FIG. 3.

FIG. 6 illustrates burst read and write operations in memory 100. The initial low transition of the RAS* signal latches a row address (R1) and the first low transition in either CASL* or CASH* latches a column address (C1). With WE* low, data will be stored in the memory array in response to low transitions in the CASL* and CASH* signals. That is, Data 1 presented on $DQ_0$–$DQ_7$ will be stored in the lower byte of the memory array when CASL* transitions low. Likewise, Data 1 presented on $DQ_8$–$DQ_{15}$ will be stored in the upper byte of the memory array when CASH* transitions low. The column address will be advanced in response to BEDOCAS* and subsequent transitions of CASL* and CASH* will store data in successive column addresses. Because CASH* transitions low only three times during the write operation, new data will not be stored in the upper byte of column C1+3. When the WE* signal goes high, a burst read operation will be initiated on the first low transition of either CASL* or CASH*. The first CASL* cycle loads a new column address (C2). Following a one cycle latency, data stored at column addresses C2, C2+1, C2+2, and C2+3 is output on successive CASL* cycles. This data is output on both bytes of the DQ outputs.

It will be appreciated by those skilled in the art that the output rate of a memory device can be increased by eliminating the need for transitions in all CAS* signals during write operations. The increased output rate is achieved by eliminating delays primarily due to the time needed to transition a loaded CAS* line and the delays resulting from signal-to-signal skew. The present invention is not intended to be limited to two CAS* BEDO memory devices, but is intended to be equally applicable in any memory device where two or more CAS* signals are used. For example, the present invention could be implemented in a 4 CAS* extended data out or page mode DRAM.

Conclusion

A method and circuit have been described which allow multiple column address strobe signals (CAS*'s) of a memory to be used in different manners for both read and write operations. A burst memory has been described in detail wherein two CAS* signals are used to independently write data to different bytes of a column of the memory. Further, the memory is described as having circuitry which allows any one of the CAS* signals to be used to output data on all of the output data communication lines. Data output rates are increased, therefore, by eliminating the need for multiple CAS* transitions for each column of data.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated memory circuit comprising:
   an array of memory cells arranged in rows and columns;
   a plurality of column address strobe inputs;
   data output circuitry for reading a plurality of bytes of data stored in the array, and outputting the plurality of bytes of data on communication lines in response to a signal provided on one of the plurality of column address strobe inputs; and
   data input circuitry for storing one byte of data in the array in response to a signal provided on one of the plurality of column address strobe inputs.

2. The integrated memory circuit of claim 1 having first and second column address strobe inputs, wherein the data input circuitry stores one byte of data in the array in response to a signal provided on the first column address strobe input, and stores one byte of data in the array in response to a signal provided on the second column address strobe input.

3. The integrated memory circuit of claim 1 wherein the memory circuit is a dynamic random access memory (DRAM).

4. The integrated memory circuit of claim 3 wherein the memory circuit is an extended data output dynamic random access memory (EDO DRAM).

5. The integrated memory circuit of claim 3 wherein the memory circuit is a burst extended data output dynamic random access memory (BEDO DRAM).

6. The integrated circuit memory of claim 1 wherein the data output circuitry comprises:
   a control circuit having a read signal generator for producing a read signal in response to a signal on one of the plurality of column address strobe inputs; and
   an output buffer coupled to the control circuit for outputting on the plurality of communication lines a plurality of bytes of data stored in the array in response to the read signal.

7. The integrated circuit memory of claim 1 wherein the data input circuitry comprises:
   a control circuit having a plurality of write signal generators, each write signal generator for producing a write signal in response to one of the plurality of column address strobe inputs; and
   an input buffer coupled to the control circuit for inputting one byte of data provided on the plurality of communication lines in response to the write signal.

8. A dynamic random access memory (DRAM) comprising:
   an array of memory cells arranged in rows and columns;
   first and second column address strobe inputs;
   a plurality of communication line inputs and outputs; and
   control circuitry for storing in the array one byte of data received on the plurality of communication line inputs in response to a signal provided on the first column address strobe input, and for storing in the array one byte of data received on the plurality of communication line inputs in response to a signal provided on the second column address strobe input;
   the control circuitry further for outputting two bytes of data in response to a signal received on either the first or second column address strobe input.

9. The DRAM of claim 8 wherein the control circuitry comprises:
   a read signal generator for producing a read signal in response to an active signal on either the first or second column address strobe input;
   a first write signal generator for producing a first byte write signal in response to the first column address strobe input; and
   a second write signal generator for producing a second byte write signal in response to the second column address strobe input.

10. The DRAM of claim 9 wherein the read signal generator comprises;

a first NAND gate having a first input connected to the first column address strobe input and a second input connected to the second column address strobe input; and a second NAND gate having a first input connected to an output of the first NAND gate, and a second input connected to a write enable input.

11. A method of data storage in a memory device, the method comprising the steps of:

storing a plurality of bytes of data in the memory device in response to a plurality of column address strobe signals; and outputting a plurality of bytes of data from the memory device in response to one column address strobe signal.

12. The method of claim 11 further including the step of:

generating an internal read signal in response to the plurality of column address strobe signals, wherein the internal read signal is activated when any one of the plurality of column address strobe signals is activated.

13. The method of claim 11 further including the step of:

generating a plurality of internal write signals in response to the plurality of column address strobe signals, wherein each one of the plurality of internal write signals is activated when a corresponding one of the plurality of column address strobe signals is activated.

14. The method of claim 11 further including the steps of:

initiating a write operation;

receiving a first column address strobe signal on a first column address strobe input;

storing a byte of data in the memory device in response to the first column address strobe signal;

receiving a second column address strobe signal on a second column address strobe input;

storing a byte of data in the memory device in response to the second column address strobe signal;

initiating a read operation;

receiving a third column address strobe signal on either the first column address strobe input or the second column address strobe input; and outputting two bytes of data from the memory device in response to the third column address strobe signal.

15. The method of claim 14 further including the steps of:

generating a internal read signal in response to either the first or second column address strobe inputs, wherein the internal read signal is activated when either the first or second column address strobe signal is activated.

16. The method of claim 14 further including the step of:

generating a first internal write signal in response to the first column address strobe input, wherein the first internal write signal is activated when the first column address strobe signal is activated; and generating a second internal write signal in response to the second column address strobe input, wherein the second internal write signal is activated when the second column address strobe signal is activated.

17. The method of claim 16 further including the step of:

disabling the first and second internal write signals during a read operation.

* * * * *